United States Patent [19]

[11] 3,890,152

Ruckert et al.

[45] June 17, 1975

[54] LIGHT-SENSITIVE COPYING COMPOSITION CONTAINING DIAZO RESIN AND QUINONE DIAZIDE

[75] Inventors: Hans Ruckert, Wiesbaden-Schierstein; Rainer Unholz, Wiesbaden-Biebrich, both of Germany

[73] Assignee: Hoechst Aktiengesellschaft, Germany

[22] Filed: Sept. 21, 1972

[21] Appl. No.: 291,095

[30] Foreign Application Priority Data

Sept. 25, 1971 Germany ........................... 2147947

[52] U.S. Cl. ........................... 96/75; 96/33; 96/36; 96/36.3; 96/36.4; 96/49; 96/67; 96/91 R; 96/91 D; 96/115 R; 260/141

[51] Int. Cl. ........................................... G03f 7/08

[58] Field of Search........... 96/91 D, 91 R, 33, 36.3, 96/36.4, 36, 115 R, 75; 260/141

[56] References Cited

UNITED STATES PATENTS

| | | | |
|---|---|---|---|
| 1,967,371 | 7/1934 | Schmidt | 96/91 D |
| 2,702,243 | 2/1955 | Schmidt | 96/91 D |
| 3,113,023 | 12/1963 | Mellan | 96/91 R X |
| 3,211,553 | 10/1965 | Ito | 96/91 R X |
| 3,502,470 | 3/1970 | Delzenne et al. | 96/91 D |
| 3,526,503 | 9/1970 | Dunham et al. | 96/91 D |
| 3,544,317 | 12/1970 | Yonezawa | 96/91 D |
| 3,573,917 | 4/1972 | Okamoto | 96/91 D |
| 3,634,082 | 1/1972 | Christensen | 96/91 D |
| 3,634,086 | 1/1972 | Lawson et al. | 96/91 D |
| 3,679,419 | 7/1972 | Gillich | 96/33 |

FOREIGN PATENTS OR APPLICATIONS

| | | | |
|---|---|---|---|
| 844,039 | 8/1960 | United Kingdom | 96/91 D |

OTHER PUBLICATIONS

Kosar, J., "Light-Sensitive Systems," Wiley & Sons, 1965, p. 339, 342.

Dinaburg, M. S., "Photosensitive Diazo Cpds.," The Focal Press, 1964, p. 177–178 and 181–196.

*Primary Examiner*—Charles L. Bowers, Jr.
*Attorney, Agent, or Firm*—James E. Bryan

[57] ABSTRACT

This invention relates to a light-sensitive composition comprising at least one diazonium salt mixed condensate and at least one compound selected from the group consisting of an o-quinone diazide sulfonic amide and an o-quinone diazide sulfonic ester.

4 Claims, No Drawings

LIGHT-SENSITIVE COPYING COMPOSITION CONTAINING DIAZO RESIN AND QUINONE DIAZIDE

The present invention relates to a light-sensitive copying composition, especially in the form of a light-sensitive layer disposed on a support, which may be used for making either positive or negative reproductions from an original.

In the reproduction field, light-sensitive copying layers are normally designated as "positive-working" when their solubility in a suitable solvent, i.e. the developing solution, is increased by exposure to light; and they are called "negative-working" when their solubility is diminished by exposure. The later reaction is also called "light-hardening". This manner of designation is based on the assumption that during the processing of such reproduction materials into offset printing plates, the areas of the layer not removed by development will form the hydrophobic parts of the surface which accept printing ink.

Materials of both types, in particular those containing light-sensitive diazo compounds, are known. Well known positive working diazo compounds are mainly the o-quinone diazides, such as those described in German Patent Specification No. 854,890, and well known negative-working diazo compounds are the p-quinone diazides, e.g. those described in German Patent Specification No. 960,335, as well as certain diazonium salts, preferably in the form of their formaldehyde condensation products, which are described in German Patent Specification No. 596,731.

Further, it is known from German Patent Specification No. 1,047,622 to modify o-quinone diazides in such a manner, by appropriate substitution, that they are capable of negative development.

Further, it is known to produce negative copies from layers containing positive-working diazo compounds, and vice versa, by additional reversing steps (see German Offenlegungsschriften Nos. 1,422,921 and 1,772,978).

Further, it is possible to invert the operating method of layers by the addition of phenol resins, as is described in German Patent Specification No. 1,254,466.

Further, copying layers are known which contain salts of o-naphtho-quinone diazide sulfonic acid and p-diazo diphenylamines, together with novolaks in excess, and which are positive-working when developed with alkaline developer solutions (U.S. Pat. No. 3,288,608).

Further, it is known from German Patent Specification No. 922,506, that otherwise positive-working o-quinone diazide layers are capable of negative development with organic solvents. The quality and reliability of the copies thus produced is very limited, however, and does not satisfy present requirements.

From U.S. application Ser. No. 826,297, filed May 20, 1969, now abandoned, Example 95, a copying layer is further known which contains a diazo diphenylamine mixed condensate in the form of the diazonium salt of an o-naphthoquinone diazide sulfonic acid and which is negative-working, just like similar salts of other, non light-sensitive sulfonic acids.

The present invention provides a light-sensitive copying composition and a copying material produced therefrom, which is capable of being optionally developed, by a single process step, either into a positive or into a negative copy of good quality.

The subject of the present invention is a light-sensitive copying composition which contains at least two aromatic diazo compounds as the light-sensitive substances. The copying composition contains (a) at least one diazonium salt mixed condensate, and (b) at least one o-quinone diazide sulfonic amide and/or at least one o-quinone diazide sulfonic ester.

Further, the present invention relates to a process for optionally producing either positive or negative copies from an original by means of the same light-sensitive reproduction material, by exposure and removal of the more readily soluble parts of the layer by means of a developer solution. In the process, a copying material is used which is composed of a support and a light-sensitive layer which contains (a) at least one diazonium salt mixed condensate and (b) at least one o-quinone diazide sulfonic amide and/or o-quinone diazide sulfonic ester. Optionally, either the exposed areas of the layer are removed with an aqueous-alkaline solution, or the unexposed areas with an aqueous solution of an acid.

The copying composition according to the invention may be commercially used in the form of a solution or a disperson, e.g. as a so-called photoresist solution, which by the consumer himself is applied to a particular support, e.g. for the production of etchings, and is then dried, exposed and developed. Alternatively, the copying composition according to the invention may be marketed in the form of a solid layer on a support, i.e. as a light-sensitive copying material, which may be used, e.g. for the photomechanical production of printing plates, especially for offset printing.

The most important feature of the copying composition according to the invention and of the copying material prepared therefrom is its capability of being optionally developed into positive or negative images after the same image-wise exposure. The material thus represents a distinct advance in the art and may be used in all those cases where, in the past, there has been a demand for negative- as well as positive-working copying materials, e.g. for offset printing plates. By use of the copying material according to the invention, storage of materials, especially of less frequently used sizes, will be simplified, and the risk of such materials being stored for an unduly long time in the unexposed state will be diminished in the future.

A further application of the material according to the invention for which, however, the two possibilities of development are not required, is in the production of certain imaged stencils on transparent supports with smooth surfaces. For some purposes, it is desirable to produce stencils from originals showing certain geometrical patterns by applying to a layer, which had been exposed under an appropriate original and then developed, a colored pigment powder which adheres to such layer. Such a layer must contain a substantial proportion of highly adhesive components to retain the pigment powder. Positive layers based on o-quinone diazides containing such tacky substances are no longer capable of satisfactory development on layers having a very smooth surface, such as glass or plastic films. Surprisingly, a good developability and distinct differentiation between image and non-image areas are obtained when such materials contain, in addition to the o-quinone diazide, a negative-working diazonium salt mixed condensate. As a further advantage, such materials may be exposed again after alkaline development and thus further hardened without losing any of their adhesive effect. The proportion of adhesive resin may be up to about 85% of the dry weight of the layer components.

Layers of this type may be satisfactorily developed only by the positive process. Negative development, i.e. the removal of the unexposed parts of the layer by means of an acid developer solution, is considerably impaired by the high proportion of adhesive resin.

When it is desired to obtain good developing properties of the layer in both directions, resins may be added in the normal manner, but their proportion should not exceed aabout 30 percent of the total weight of the solid components of the layer.

By an alkaline development of the material according to the invention, a positive image is produced from a positive original, and by an acid development of the same layer, a positive image is also produced from a negative original.

It was surprising that a combination of these positive-working and negative-working diazo compounds, which by themselves yield good results, produces layers which are capable both of positive and negative development, and that the differentiation in both cases is such that it exceeds the level of a mere interesting effect, i.e. that printing plates are obtained, e.g., whose quality is absolutely comparable to that of known positive or negative printing plates. Since, during exposure under a positive original, the positive diazo compound is converted into the alkali-soluble form, whereas the negative diazo compound is simultaneously decomposed and at the same time becomes cross-linked, it was to be expected that the dissolution of the exposed areas of the layer in the alkaline developer solution and the formation of a positive image would be made impossible. On the other hand, in the case of the development of the unexposed areas of the layer to a negative, it was to be expected that the mixed condensate, which by itself is capable of an acid development, would at least be considerably impaired in its developability by the addition of the positive diazo compound. Obviously, however, these effects are so slight in each case that the differentiation is more than satisfactory under appropriate conditions. A reliable processing is still possible even after some weeks of storage under severe conditions.

The positive-negative layers according to the present invention possess considerable resistance to etching, which may even be increased by the addition of resins. The etching resistance, i.e. acid resistance, of the positively developed material is inferior to that of the negatively developed material. Like normal positive layers, the layers according to the present invention have the advantage that the areas of the layer which are still light-sensitive after positive development may again be exposed under a different original and then developed. This means that e.g., additional matter may be incorporated by a second copying process. Further, it is possible to completely expose or decompose the residual light-sensitive layer by exposure without an orginal. By this over-all exposure, the resistance of the positively or negatively developed layer towards acids and solvents may be increased.

A possible after-exposure of the positively developed copy is of importance not only for planographic printing, for increasing the resistance against acid fountain solutions and the number of possible copies to be printed, but also in the case of excessive etching strain, e.g. for the powderless etching of zinc plates to be used as relief plates. By an after-exposure of the positive copy approximately the same hardening effect may be achieved, with considerably less expenditure, as by the known thermal treatment (burning-in) of positive planographic or relief printing plates. Of course, when the plates have to meet very high demands, positively developed as well as negatively developed plates may be improved by heat treatment. The most favorable time and temperature conditions for such a treatment are relatively low.

Another advantage of the positive-negative layers according to the invention is utilized when they are used for the production of multi-metal planographic printing plates. After exposure and development of the copying layer, the bared chromium or copper layer first must be etched away with an appropriate etching solution, and the etch resist then must be removed. In most cases, this decoating step proceeds more smoothly in the case of the layers according to the invention than in the case of negative layers which are difficult to remove.

The copying composition according to the invention and the copying material produced therefrom contain, as the negative-working light-sensitive component, a diazonium salt mixed condensate. Such mixed condensates are described in detail in U.S. application Ser. No. 826,297, filed May 20, 1969, now abandoned, and U.S. Pat. Nos. 3,849,392 and 3,679,419. They consist of at least one unit each of types $A(—D)_n$ and B, which are connected by a bivalent intermediate member derived from a condensable carbonyl compound and wherein

- A is a radical of a compound containing at least two isocyclic or heterocyclic aromatic nuclei, which compound is capable of condensation in at least one position with an active carbonyl compound in an acid medium,
- D is a diazonium salt group attached to an aromatic carbon atom of A,
- $n$ is an integer from 1 to 10, and
- B is a radical of a compound free of diazonium groups, which compound is capable of condensation in at least one position with an active carbonyl compound in an acid medium and includes aromatic amines, phenols, thiophenols, phenol ethers, aromatic thioethers, aromatic heterocyclic compounds, aromatic hydrocarbons, and organic acid amides.

The condensation products are produced either by condensing, in a strong acid, the compounds $A(—D)_n$ and B with active carbonyl compound, preferably formaldehyde, or by condensing $A(—D)_n$ compounds with $E(—CHR_a—O—R_b)_m$ compounds, wherein

- E is a residue obtained by the splitting-off of $m$ H atoms from a compound of type B,
- $R_a$ is selected from the group consisting of hydrogen, alkyl, aryl, and heterocyclic groups, but preferably is H,
- $R_b$ is selected from the group consisting of hydrogen, alkyl, or acyl groups, but preferably is H or methyl, and
- $m$ is an integer from 1 to 10.

Among the diazonium compounds of type $A(—D)_n$, those are preferred which correspond to the general formula $(R_1 - R_3 -)_p R_2 - N_2X$ and

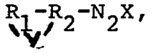

wherein $p$ is an integer from 1 to 3, but preferably is 1,

X is the anion of the diazonium salt, $R_1$ is an isocyclic or heterocyclic aromatic radical, containing at least one position capable of condensation, preferably a substituted or unsubstituted phenyl group, and includes a naphthalene group, $R_2$ is a benzene or naphthalene ring, preferably a substituted or unsubstituted benzene ring, and $R_3$ is an intermediate member between the rings $R_1$ and $R_2$ of one of the following types:

simple homopolar bond $-(CH_2)_q - NR_4 -$ $- O - (CH_2)_r - NR_4 -$ $- S - (CH_2)_r - NR_4 -$ $- S - CH_2 - CO - NR_4 -$ $- O - R_5 - O -$ $- O -$ $- S -$ $- CONR_4 -$ and $- SO_2 - NR_4 -$ wherein $q$ is an integer from 0 to 5, and $R_4$ is either H, or alkyl with 1 to 5 carbon atoms, or aryl with 6 to 12 carbon atoms, or aralkyl with 7 to 12 carbon atoms $R_5$ is an arylene group having 6 to 12 carbon atoms — Y — is one of the groups — NH —, and — 0 —, which diazonium compound contains, on the average, about 0.01 to 50 B units per unit of $A - N_2X$.

Exemplary of compounds of the formula $(R_1 - R_3 -)_p R_2 - N_2X$ are 2,3′,5-trimethoxy-diphenyl-4-diazonium chloride
2,4′,5-triethoxy-diphenyl-4-diazonium chloride
4-[3-(3-methoxy-phenyl)-propylamino]-benzene diazonium sulfate
4-[N-ethyl-N-(4-methoxy-benzyl)-amino]-benzene diazonium chloride
4-[N-(naphthyl-(2)-methyl)-N-n-propyl-amino]-benzene, diazonium sulfate
4-[N-(3-phenoxy-propy)-N-methyl-amino]-2,5-dimethoxy-benzene diazonium tetrafluoroborate
4-[N-(2-phenylmercapto-propyl)-N-ethyl-amino]-2-chloro-5-methoxybenzene diazonium chloride
4-[4-(3-methyl-phenoxy)-phenoxy]-2,5-dimethoxy-benzene diazonium chloride
4-(4-methoxy-phenylmercapto)-2,5-diethoxy-benzene diazonium chloride
2,5-diethoxy-4-phenoxy-benzene diazonium chloride
4-(3,5-dimethoxy-benzoylamino)-2,5-diethoxy-benzene diazonium hexafluorophosphate
carbazole-3-diazonium chloride
3-methoxy-diphenyleneoxide-2-diazonium chloride
diphenylamine-4-diazonium sulfate.

Diphenylamine-4-diazonium salts, which may be substituted, and in particular the 3-alkoxy-diphenylamine-4-diazonium salts, are preferred.

The preferred components of type B are aromatic hydrocarbons, nonbasic heterocyclic compounds, phenols, phenol ethers, aromatic thiothers, and acid amides.

Advantageously, the mixed condensates are used in the form of the salts of organic sulfonic acids.

The preferred positive-working diazo compounds are the derivatives of o-quinone diazides, especially of o-naphthoquinone diazides, which have long been used to advantage in practice. Such compounds are known, e.g., from U.S. Pat. Nos. 3,046,121, 2,767,092, 3,046,123, 2,766,118, 3,106,465, and 3,180,733. Further representatives of this type are described in U.S. Pat. No. 3,751,285.

Inclusive of the preferred o-naphthoquinone diazides are (1) o-naphthoquinone diazide sulfonic amides derived from primary aliphatic amines with two to nine carbon atoms, (2) o-naphthoquinone diazide sulfonic esters of the general formulae

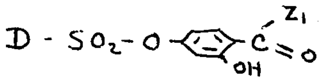

and

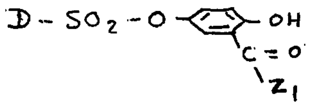

wherein

D is a naphthoquinone (1,2)-diazide residue,

Z is H or OH;

$Z_1$ is H, $OZ_2$, $NZ_3Z_4$ or alkyl, aryl or heteroyl;

$Z_2$ is alkyl or aryl;

and $Z_3$ and $Z_4$ are H, alkyl or aryl, and (3) the 4-cumyl-phenylester of naphthoquinone-(1,2)-diazide-(2)-4-sulfonic acid.

In order to produce positively-developed or negatively developed copies of well-balanced quality, the ratios of positive-working and negative-working diazo compounds must be within a certain range. Good copies are normally obtained when the proportions of the two components are such that about 0.5 to 4 diazide groups of the quinone diazide are present per diazonium salt group of the diazonium salt mixed condensate. The preferred ratio is between 1 and 2 diazide groups per diazonium salt group. The most favorable ratio for each combination may be determined by simple tests, with the composition of the layer being capable of further adjustment by the addition of resins, if desired.

The mixture of positive-working and negative-working diazo compounds used according to the invention yields smooth layers of excellent quality. The crystallization tendency observed in many positive-working diazo compounds is completely suppressed by the diazo mixed condensates which, in a sense, have resinous character. Therefore, the combination of light-sensitive compounds satisfies in most cases the requirements made of a layer. If, however, a higher viscosity of the coating solution, or a better adhesion of the layer to the support, or an improved light-sensitivity, or better resistance to etching solutions are desired, it may be of advantage in some cases to use additional resins. However, in view of the necessity to produce a definite positive or negative copy, it is reasonable to add only a limited amount of resins, as already mentioned above. A great number of resins are suitable, e.g. epoxy resins, polyvinyl acetate, styrene/maleic anhydride resins, alkyd resins, phenol resins, ketone resins, or chlorodiphenyl resins. The selection of the resin and its adjustment to the types and proportions of the two diazo compounds present and to the two developers depends largely upon the desired effect. If desired, the layer may contain other known additives, especially dyes.

The films and plates normally used in the printing trade may be used as supports for the light-sensitive layers according to the invention. After the usual cleaning and preconditioning treatments, the following supports may be used for coating: metals, such as aluminum, magnesium, zinc, copper, nickel or chromium, and plastic films, e.g. polyester films. Adjustment of the layer composition to the surface of the support, the thickness of the layer, the drying process, and the developer to be used is very important in each case. Normally, supports having a smooth surface yield somewhat better results. Thus, for the production of offset printing plates, for example, smooth rolled aluminum is superior to the mechanically roughened aluminum normally used.

The reproduction material according to the invention is processed into a printing form in the normal manner. Exposure is under a positive or negative original, using the light sources conventionally used for making reproductions.

When the material is processed to yield a positive layer, development is the same as in the case of known, only positive-working layers, i.e. the exposed areas of the layer are removed by means of aqueous alkaline solutions.

The alkaline developers may contain or consist of free alkalies. Buffered alkaline solutions containing commercial alkali phosphates and/or alkali silicates are preferred. The pH values of these developers are preferably within the range of about 11 to 14, but in many cases solutions having lower pH values within the alkaline range may be used. By varying the concentrations and quantitative proportions of the substances contained therein, the positive developers may be varied within wide limits and attuned to the layers to be developed. Moreover, anionic or neutral wetting agents and/or organic solvents may be added to the developer solutions.

Development of the unexposed areas of the layer is performed by means of an acid developer solution, which advantageously contains additional solvents. Mineral acids, phosphoric acid, organic acids such as tartaric acid and citric acid, and acid salts are useful for this purpose. Solvents which may be contained in the negative developers are: alcohols, e.g. lower aliphatic alcohols, benzyl alcohol, ether alcohols, such as ethyleneglycol monomethyl ether or ethyleneglycol monoethyl ether, and lower ketones. The pH value of the acid developer solution is preferably within the range of about 0 to 4, with minor deviations to either side being possible. It must be taken into consideration, however, that no exact definition of the pH value is possible when the solution contains organic solvents. In principle, the unexposed parts of the layer may be removed by liquids which dissolve the two diazo compounds, but do not dissolve the cross-linking products of the mixed condensate. Normally, it is advisable to add a cationic or neutral wetting agent. The activity of the negative developers may also be adjusted to the layers to be developed by appropriate selection of the components and varying their concentrations and quantitative proportions.

Negative development as well as positive development should be assisted by mechanical means, such as dabbing, rubbing, brushing, or spraying of the layer. A simple immersion development is seldom possible.

After development, the planographic printing forms prepared from the light-sensitive copying material according to the invention are inked up with greasy ink in the normal manner.

In the case of bimetal and trimetal plates, or of relief and intaglio plates and cylinders, and of printed circuits and the like, the supporting materials are etched in the bared areas in known manner, by means of special etching solutions.

If the layer is to be removed after development and etching, as in the case of bimetal and trimetal plates, this removal may be effected by means of the other developer solution in each case. It has proved advantageous to apply the developer by means of cotton pads and to add either more and/or stronger solvents, e.g. dimethyl formamide, butyrolactone, or methylene chloride. Alternatively, the unexposed residual layer may be removed with pure solvent, e.g. the one used for coating, or, when the material has been subjected to an afterexposure without the original, by treatment with an alkaline developer to which a solvent may be added, if desired.

The material according to the invention is distinguished by its good light-sensitivity and storability, and ensuing speed and reliability of processing. It requires the same process steps to develop the copying material according to the invention either into a negative or into a positive copy, so that development is simple.

The invention will be illustrated in detail by the following examples. The relation between parts by weight and parts by volume corresponds to that between grams and milliliters. All proportions and percentages are by weight unless otherwise stated. The pH values stated are the values determined by a glass electrode in the respective solutions. In many cases, they are to be regarded only as approximate orientation values, since the accuracy of measurement is impaired by the varying contents of organic solvents.

EXAMPLE 1

3 parts by weight of the condensation product of 3-methoxydiphenylamine-4-diazonium sulfate and methoxymethylated 4,4'-dimethyl-diphenylether, prepared as described in Example 108 of application Ser. No. 826,297, filed May 20, 1969, now abandoned, and 3 parts by weight of the 4-cumyl-phenylester of naphthoquinone-(1,2)-diazide-(2)-4-sulfonic acid were dissolved in 100 parts by volume of ethyleneglycol monoethyl ether. A degreased, smooth rolled aluminum foil was coated, on a whirler, with this solution and then dried first with warm air and then for 5 minutes at 100°C.

One half of the plate was exposed under a negative original and the other half under a positive original, using the light emitted by a carbon arc lamp for exposure. The material which had been exposed under the positive original was developed by 3 minutes' immersion in and wiping with an 8% trisodium phosphate solution to which 1% of sodium alkyl polyglycol ether sulfate ("Genapol LRO fluessig", a product of Farbwerke Hoechst A.G., Frankfurt, Germany) had been added (pH value 12.9); and the material exposed under the negative original was developed by 1 minute's immersion, with wiping, in an aqueous solution which contained 1% of phosphoric acid, 2% of tartaric acid, 3% of benzyl alcohol, and 2% of sodium lauryl sulfate (85–89% concentration) and had a pH value of 2.0.

After development, the materials were inked up in the normal manner with greasy ink, the ink being retained only by those areas where the layer had not been removed during development. During the following printing step, in an offset printing machine, positive prints were obtained in both cases.

EXAMPLE 2

4 parts by weight of the condensation product used in Example 1, 4 parts by weight of the 2, 3, 4-trihydroxy-benzophenone ester of naphthoquinone-(1,2)-diazide-(2)-5-sulfonic acid, 2 parts by weight of an epoxy resin of bisphenol A and epichlorohydrin having an epoxy equivalent weight of 450 – 500 and a molecular weight below about 1,000, and 0.3 part by weight of Crystal Violet (C.I. 42555) were dissolved in 100 parts by volume of ethyleneglycol monomethyl ether. A cleaned zinc plate was coated with this solution, dried, and then one half of it was exposed under a positive halftone original and the other half under a negative halftone original. The plate exposed under the negative original was developed by 2 minutes' immersion, with dabbing, in a 1:1 mixture of 10% phosphoric acid and ethyleneglycol monoethyl ether, and the plate exposed under the positive original was developed with 5% caustic soda solution containing 1.5% of sodium alkyl aryl sulfonate (65% concentration, "Phenylsulfonat HSR konz." , a product of Farbwerke Hoechst A.G., Frankfurt, Germany) and 5% of the wetting agent used in the alkaline developer of Example 1 (pH 13.1). By removal of the layer in the non-image areas of both plates, positive images were obtained which were processed into relief plates by etching them, with the use of an edge protecting agent, in a powderless etching machine. The etch resistance of the layer exposed under the negative original surpassed that of the layer exposed under the positive original and even would be sufficient for a 16 minutes' etching process for a line-halftone combination. By afterexposure of the already developed positive copy, the same etching resistance is achieved.

EXAMPLE 3

3 parts by weight of a condensation product of 3-methoxydiphenylamine-4-diazonium sulfate and 4,4'-bis-methoxy-methyldiphenylether, prepared in accordance with Example 1 of U.S. Pat. No. 3,679,419, parts by weight of the naphthoquinone diazide derivative used in Example 2, and 0.5 part by weight of Zapon Fast Violet BE (C.I. No. 12,196) were dissolved in a mixture of 80 parts by volume of ethyleneglycol monoethyl ether and 20 parts by volume of butyrolactone. A trimetal plate consisting of layers of aluminum, copper, and chromium was coated with this solution and then dried. For the preparation of a printing plate, the plate was exposed under a negative original and developed with a 6% aqueous solution of potassium triphosphate.

For the preparation of a similar printing plate by another method, the plate was exposed under a positive original and developed with the acid developer mentioned in Example 1 to which, however, 10% of n-propanol had been added (pH 2.2). In both cases, the chromium layer bared by the developing process was dissolved away with one of the conventional chromium etches.

After etching, the exposed layer parts of the negatively exposed copy were removed by immersion in and wiping with the alkaline developer; decoating could be speeded up by adding 10% of dimethyl formamide. The unexposed parts of the layer on the positively exposed copy were decoated by exposing the copy without an original and wiping it over with the alkaline developer. Also in this case, decoating could be accelerated by the addition of 10% of dimethyl formamide. A mixture of ethyl acetate, benzyl alcohol and methylene chloride (3:3:4 parts by volume) or the acid developer could be used with the same results.

In both cases, a printing plate was obtained in which the image areas used for printing consisted of copper, whereas the non-image areas consisted of chromium.

EXAMPLE 4

2 parts by weight of the naphthoquinone diazide derivative used in Example 2 and 2 parts by weight of the condensation product used in Example 3, but separated in the form of the bromide, and 0.5 part by weight of Sudan Deep Black BB (C.I. No. 26,150) were dissolved in a mixture of 80 parts by vol. of ethyleneglycol monomethyl ether and 20 parts by vol. of butyl acetate. A degreased foil of smooth rolled aluminum was coated with this solution on a whirler.

After drying and exposure, the positive copy was developed with a 5% trisodium phosphate solution, and the negative copy with a mixture of 60 parts by vol. of 10% citric acid and 40 parts by vol. of isopropanol.

For a comparative printing test, a plate exposed under a negative, a plate exposed under a positive, and a plate exposed under a positive and then subjected to after-exposure after development, were inked up and printed side by side. The quality of the three plates was then judged by the original and the continuous tone step wedge under which they had been exposed. The negative plate had a steeper gradation. The resolution was good in all three cases, and development without scumming was assisted by using a support with a smoother and more hydrophilic surface and by treatment with acid hydrophilizing solutions. The printing test was interrupted after a run of 23,000 copies, because the plates were no longer capable of printing without scumming and their ink receptivity decreased. This decrease in ink receptivity was the least marked in the case of the positive plates, the 120 line screen of which broke off at step 2 of the UGRA step wedge after this run, whereas the 60 line screen was still intact at step 1. In the case of the simultaneously printed negative plate, the 120 line screen was of poorer quality, whereas the 60 line screen was still intact at step 10.

EXAMPLE 5

3 parts by weight of the n-butylamide of naphthoquinone-(1,2)-diazide (2)-5-sulfonic acid, 3 parts by weight of a condensation product of 3-methoxy-diphenylamine-4-diazonium sulfate and 4,4'-bismethoxy-methyl diphenyl ether, prepared in accordance with Example 57 of application Ser. No. 826,297, filed May 20, 1969, now abandoned (N content: 6.3%), 1 part by weight of polyvinyl acetate of an approximate molecular weight of 260,000 ("Mowilith 50", a product of Farbwerke Hoechst A.G., Frankfurt, Germany) and 0.2 part by weight of Patent Blue V (C.I. No. 42,045) were dissolved in a mixture of 90 parts by volume of ethyleneglycol monoethyl ether and 10 parts by volume of diacetone alcohol. A bimetal plate having layers of brass and chromium was coated with this solution and then dried. For the preparation of a planographic printing plate capable of long runs, the light-sensitive plate was further processed as described in Example 3.

The negative copy, which had been exposed for 3 minutes at a distance of 65 cm under a 5,000 watt xenon lamp, was developed with a 5% trisodium phosphate solution containing 2% of phenyl sulfonate HSR knoz. (pH value 12.6). In the case of the positive copy, the unexposed areas were developed with a 10% solution of phosphoric acid to which 1% of sodium lauryl sulfate had been added (pH value 2.8). After having been stored for three weeks at a temperature of 52°C, the positive-negative plate was still capable of being processed.

After etching, the plate could be decoated as described in Example 3. The printing plates thus produced were inked up in the normal manner and then coated, e.g. with gum arabic, for storage until printing was begun.

EXAMPLE 6

4 parts by weight of a condensation product of 3-methoxydiphenyl-amine-4-diazonium sulfate and 4,6-diisopropyl-1,3-dimethylolbenzene, prepared in accordance with Example 57 of U.S. Pat. No. 3,849,392, 2 parts by weight of the naphthoquinone diazide derivative used in Example 2, 1 part by weight of chlorodiphenyl resin ("Chlophenharz", a product of Farbenfabriken Bayer, Leverkusen, Germany), and 0.3 part by weight of Crystal Violet were dissolved in a mixture of diacetone alcohol, ethyleneglycol monoethyl ether and chloroform (20 : 60 : 20 parts by vol.). A cleaned copper plate was coated with this solution by spraying with a spray gun. This method also may be used for evenly coating a rotating copper gravure cylinder. For halftone gravure printing, the light-sensitive positive-negative plate was processed as a negative layer, i.e. it was exposed under a positive screen original and developed with a 15% solution of hydrochloric acid. Where the plate was exposed under a negative original, it was developed by wiping it with a 5% aqueous solution of trisodium phosphate.

In both cases, an image was obtained in which the copper layer was bared in the areas from which printing was to be done. The bared copper was etched in the normal manner with a $FeCl_3$ solution until cups of a depth and clumps of a width were obtained which are known, from experience, to be most advantageous for printing.

After etching, the plates were decoated by wiping them with a solvent, e.g. ethyleneglycol monomethyl ether, dimethyl formamide, butyrolactone, or a solvent mixture, or with the alkaline or acid developer, as the case may be, to which such solvents may be added. The halftone gravure form thus produced could be chromium plated when very long runs were to be printed.

EXAMPLE 7

A zinc plate which had been degreased and chemically roughened by pouring a 0.6% solution of nitric acid over it was coated, on a whirler, with a solution containing 4 parts by weight of the naphthoquinone diazide derivative used in Example 1, 3 parts by weight of the condensation product used in Example 2, 2 parts by weight of a maleic acid anhydride / styrene copolymer having an acid number of 180 and an average molecular weight of about 20,000, and 0.5 part by weight of Alizarin Irisol RL (C.I. No. 62,010) in a mixture of 50 parts by vol. of diethyleneglycol monoethyl ether and 50 parts by vol. of chloroform. For the preparation of a deep-etched relief plate containing text and a line pattern, one half of the plate was exposed under a corresponding positive original and the other half under a negative original. The developer used for the plate exposed under the positive was a 5% aqueous solution of trisodium phosphate to which 10% of ethyleneglycol monomethyl ether had been added (pH value 12.2), and the plate exposed under a negative original was developed with a mixture of 90 parts by vol. of the acid developer mentioned in Example 1 and 10 parts by vol. of n-propanol (pH value 1.8). After development, the plates were heated for about 10 minutes to 180°C in a burning-in process conventional in process work. By this treatment, the etch-resistant layer was further hardened, so that it withstood, without damage, the following powderless etching process of about 30 minutes duration, which resulted in an etching depth of at least 1 mm. The plate was capable of being after-etched, in the normal manner, by immersion in 5% nitric acid and application of a deep-etch pad for tone correction of the line pattern.

Relief plates thus obtained may be used either for printing, or for the production of mats.

EXAMPLE 8

For the preparation of a registration guide for mounting offset plates, a mixture containing 3 parts by weight of the naphthoquinone diazide derivative used in Example 5, 3 parts by weight of the condensation product already used in Example 1, but separated in the form of the methane sulfonate, and 0.5 part by weight of Zapon Fast Blue HFL (C.I. No. 74,350) was dissolved in 100 parts by volume of ethyleneglycol monomethyl ether, and the solution was coated upon a 100 $\mu$ thick polyester film which was then exposed under a positive original. One half of the film was developed by immersion in and wiping with a 5% aqueous solution of trisodium phosphate to which 1% of Genapol LRO (a product of Farbwerke Hoechst A.G., Frankfurt, Germany) had been added, and the other half of the film was developed with 5% phosphoric acid. On a transparent, colorless background, two images of the original in a lively blue color were thus obtained, viz. a positive and a negative image.

EXAMPLE 9

5 parts by weight of the naphthoquinone diazide derivative used in Example 2, 3 parts by weight of the condensation product used in Example 3, 1 part by weight of a cyclohexanone-formaldehyde resin having a softening range of 75° – 90°C ("Kunstharz AFS", a product of Farbenfabriken Bayer, Leverkusen, Germany), and 0.4 part by weight of Crystal Violet were dissolved in a mixture of diacetone alcohol and trichloroethylene (2 : 1 parts by volume).

This solution was used for dip-coating a support consisting of an electrically insulating plastic foil to which an about 30 μ thick copper layer had been applied which had been thoroughly cleaned before coating. The solution applied to the copper layer was then dried. After drying, half of the layer was exposed under a positive original showing a wiring diagram, and the other half under a negative original of the wiring diagram, and the non-image areas were then removed with the appropriate developer solutions. The alkaline developer used was a 0.5 caustic soda solution, and the negative developer was a 1 : 1 mixture of 10% tartaric acid and ethyleneglycol monoethyl ether (pH 2.9). The bared copper areas were etched away with an iron trichloride solution. In each case, a printed circuit was obtained which showed a positive image of the original.

EXAMPLE 10

4 parts by weight of the naphthoquinone diazide derivative used in Example 2, 3 parts by weight of the condensation product used in Example 1, and 0.25 part by weight of Crystal Violet were dissolved in 100 parts by vol. of a 9:1 mixture of ethyleneglycol monoethyl ether and dimethyl formamide. An aluminum foil which had been carefully degreased was coated with this solution and then dried. Two samples of the resulting plate were exposed, one under a positive original, and the other under a negative original, then developed with the appropriate developers described in Example 1, and further processed for printing. The storability of the light-sensitive material thus obtained was very good. Even after a 3 months' storage at a temperature of 52°C, the material could be processed into a positive or negative copy with equal ease.

EXAMPLE 11

3 parts by weight of the 2-[ 1-methyl-benzimidazolyl-(2) ]-phenyl ester of naphthoquinone-(1,2)-diazide-(2)-4-sulfonic acid (see German Patent Specification No. 1,047,622, Formula 1), 3 parts by weight of the condensation product used in Example 3, but separated in the form of the bromide, 2 parts by weight of an alkyd resin having a melting point of 55° – 65°C and an acid number of 180–200 ("Alftalat 420 A", a product of Chemische Werke Albert, Wiesbaden-Biebrich, Germany), and 0.4 part by weight of Zapon Fast Violet BE were dissolved in 100 parts by volume of ethyleneglycol monoethyl ether. A cleaned bimetal foil consisting of layers of aluminum and copper was coated with this solution and then dried. The resulting light-sensitive material was exposed under a negative original with writing thereon and developed with a mixture of 40 parts by vol. of 10% citric acid and 60 parts by vol. of ethyleneglycol monoethyl ether. Alternatively, the material could be exposed under a positive original and then developed with the alkaline developer solution used in Example 2.

By means of an appropriate etching solution, the copper was etched away in the bared image areas to the aluminum beneath.

EXAMPLE 12

A mechanically roughened aluminum foil was coated, on a whirler, with a solution containing 3 parts by weight of each of the diazo compounds mentioned in Example 3 in 100 parts by volume of ethyleneglycol monomethyl ether. To improve the developability of the plate, 0.25 part by vol. of 85% phosphoric acid and, as a dyestuff, 0.25 part by weight of Crystal Violet were added to the solution.

After exposure under a positive original, the layer was developed with a 6% tripotassium phosphate solution (pH value 12.7), and after exposure under a negative by wiping it with a 2 : 1 mixture of a 10% nitric acid solution and isopropanol. After rinsing with water, the two plates were inked up with printing ink and provided with a protective coating for printing at a later time.

EXAMPLE 13

A mixture of 2.5 parts by weight of the condensation product used in Example 8, 2.5 parts by weight of the naphthoquinone diazide derivative used in Example 1, and 0.5 part by weight of Zapon Fast Red 3 B (C.I. No. 45,170) was dissolved in a 80 : 20 mixture of ethyleneglycol monomethyl ether and butyl acetate and applied to a 180 μ thick polyethylene terephthalate film, by dip coating. The coating was then dried with warm air. The colored film thus produced was suitable for use as a positively or negatively working material for mounting offset color prints. The positive developer used was a 2% trisodium phosphate solution, and the negative developer was a 3 : 1 mixture of 10% phosphoric acid and isopropanol (pH value 2.4).

EXAMPLE 14

A degreased foil of smooth rolled aluminum was coated, on a whirler, with a solution containing 2 parts by weight of the naphthoquinone diazide derivative used in Example 2, 2 parts by weight of the condensation product used in Example 5, 0.5 part by weight of a phenol/formaldehyde novolak ("Alnovol PN 429", a product of Chemische Werke Albert, Wiesbaden-Biebrich, Germany), and 0.3 part by weight of Patent Blue V in 100 parts by volume of a 9 : 1 mixture of ethylene-glycol monomethyl ether and dimethyl formamide. After exposure under a positive and a negative original and development with the developers mentioned in Example 1, positive planographic printing plates were obtained.

EXAMPLE 15

A glass plate degreased with acetone was coated, on a whirler, with a solution containing 1.5 parts by weight of the naphthoquinone diazide derivative used in Example 2, 1.5 parts by weight of the condensation product used in Example 1, and 10 parts by weight of polyvinyl ethyl ether ("Lutonal A 50", a product of Badische Anilin- & Sodafabrik, Ludwigshafen, Germany) in 100 parts by vol. of ethyleneglycol monoethyl ether. This highly adhesive layer was exposed once under a positive line original, by projection, and once in contact with a 34 line screen, after covering its tackiness with a coating of an aqueous polyvinyl alcohol solution ("Mowiol N 75-88", a product of Farbwerke Hoechst A.G., Frankfurt, Germany). The exposed portions of the layer in both samples were then removed by immersion in and wiping with a 8% caustic soda solution and the plates were rinsed with water and then dried. The unexposed portions of the layer representing an image formed by the residual adhesive layer were then colored black by dusting or wiping with finely divided carbon black and rinsing off excess carbon black. If no diazo condensate was added, the adhesion of the layer to the glass plate was not sufficient for alkaline development.

EXAMPLE 16

A 0.18 mm thick polyester film was coated with a solution containing 2 parts by weight of the naphthoquinone diazide derivative used in Example 2, 1.5 parts by weight of the condensation product described below, and 8 parts by weight of polyvinyl ethyl ether in 100 parts by volume of ethyleneglycol monoethyl ether. The resulting material was exposed under a coarse line original, without contacting it, then developed with a 5% trisodium phosphate solution, rinsed with water, and dried. For the preparation of luminous plates, the material was wiped over with a luminous pigment ("Leuchtfarbe No. 15", a product of Riedel-deHaen A.G., Seelze bei Hannover, Germany), and excess pigment was rinsed away.

Alternatively, the layer may be processed as a negative layer, which means that the unexposed parts of the layer are removed by means of an acid developer solution to which some solvent is added. In this case, however, the adhesive effect is substantially less marked than in the positive copy.

The diazo condensate used in this example was prepared as follows:

25.8 parts by weight of 4,4'-bis-methoxymethyl-diphenyl ether were added, drop-by-drop and with stirring, to a solution of 32.3 parts by weight of 3-methoxy-diphenylamine-4-diazonium sulfate in 100 parts by vol. of 86% phosphoric acid. After condensing the mixture for 17 hours at 40°C, the methane sulfonate of the condensation product was precipitated by adding 350 parts by vol. of an aqueous solution which was free of chloride and contained 200 parts by weight of sodium methane sulfonate.

For purification, the product was dissolved in water, again precipitated by adding excess sodium methane sulfonate, drawn off by suction, and dried over phosphorus pentoxide.

Yield: 53 parts by weight, (C 55.3%; N 6.5%; S 6.2%; P 1.9%; Cl<0.1%; $H_2O$ 4.3%).

It will be obvious to those skilled in the art that many modifications may be made within the scope of the present invention without departing from the spirit thereof, and the invention includes all such modifications.

What is claimed is:

1. A light-sensitive composition comprising, in a homogeneous admixture, (I) at least one diazonium salt mixed condensation product comprising repeating units of each of the general types $A-N_2X$ and B which are linked by methylene groups, in which $A-N_2X$ is a radical of a compound of one of the general formulae $$(R_1-R_3-)_pR_2-N_2X \quad \text{and} \quad \underbrace{R_1 - R_2}_{Y}-N_2X$$

wherein $R_1$ is an arylene group of the benzene or naphthalene series, $R_2$ is a phenylene group, $R_3$ is a simple homopolar bond or one of the groups $-(CH_2)_q-NR_4-$,
$-O-(CH_2)_r-NR_4-$
$-S-(CH_2)_r-NR_4-$
$-S-CH_2-CO-NR_4-$
$-O-R_5-O-$
$-O-$
$-S-$ or
$-CO-NR_4-$ the left-hand free valence of the specified groups is attached to $R_1$ and the right-hand free valence is attached to $R_2$, $q$ is a number from 0 to 5

$r$ is a number from 2 to 5

$R_4$ is selected from the group consisting of hydrogen, alkyl with 1 to 5 carbon atoms, aralkyl with 7 to 12 carbon atoms, and aryl with 6 to 12 carbon atoms, $R_5$ is an arylene group having 6 to 12 carbon atoms $-Y-$ is one of the groups $-NH-$, and $-O-$ X is the anion of the diazonium compound, and $p$ is a number from 1 to 3, and B is a radical of a compound free of diazonium groups selected from the group consisting of aromatic amines, phenols, thiophenols, phenol ethers, aromatic thioethers, aromatic heterocyclic compounds, aromatic hydrocarbons and organic acid amides, which condensation product contains, on the average, about 0.01 to 50 B units per unit of $A-N_2X$, and (II) at least one compound selected from the group consisting of (a) an o-naphthoquinone diazide sulfonic amide derived from a primary aliphatic amine with two to nine carbon atoms, (b) an o-naphthoquinone diazide sulfonic ester of one of the general formulae

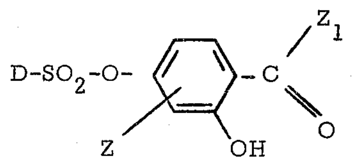

and

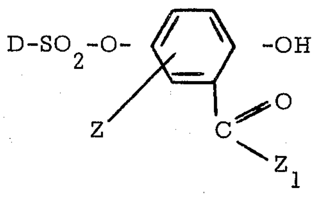

wherein

D is a naphthoquinone (1,2)-diazide residue;

Z is H or OH;

$Z_1$ is H, $OZ_2$, $NZ_3Z_4$ or alkyl, aryl or heteroyl;

$Z_2$ is alkyl or aryl;

and $Z_3$ and $Z_4$ are H, alkyl or aryl, and (c) the 4-cumyl-phenylester of naphthoquinone-(1,2)-diazide-(2)-4-sulfonic acid, the components (I) and (II) being present in quantities such that 0.5 to 4 diazide groups are present per diazonium salt group wherein said composition when used as a supported light-sensitive layer is capable, after imagewise exposure to actinic light, of forming a positive or negative image in the same said layer dependent only on choice of developer, and wherein said positive image is formed using an aqueous alkaline developer and said negative image is formed using an aqueous acidic developer.

2. A light-sensitive composition according to claim 1, containing the diazonium salt mixed condensate and the o-quinone diazide sulfonic acid derivative in quantities such that 1 to 2 diazide groups are present per diazonium salt group.

3. A light-sensitive composition according to claim 1, in the form of a solid light-sensitive layer on a support.

4. A light-sensitive composition according to claim 3, in which the support is an aluminum plate.

* * * * *